United States Patent [19]

Schoolar et al.

[11] Patent Number: 4,482,881
[45] Date of Patent: Nov. 13, 1984

[54] THICK EXTENDED CONTACT PHOTOCONDUCTOR

[75] Inventors: Richard B. Schoolar, Westminster; Alfred A. Fote, Santa Monica, both of Calif.

[73] Assignee: The Aerospace Corporation, El Segundo, Calif.

[21] Appl. No.: 399,267

[22] Filed: Jul. 19, 1982

[51] Int. Cl.³ .............................................. H01L 31/08
[52] U.S. Cl. ........................................ 338/15; 338/17; 250/211 J
[58] Field of Search ................... 338/15, 17, 18, 307, 338/308, 309; 250/211 R, 211 J

[56] References Cited

U.S. PATENT DOCUMENTS

| | | | |
|---|---|---|---|
| 3,523,188 | 8/1970 | Kazan et al. | 250/211 R |
| 3,968,360 | 7/1976 | Monnier | 338/18 X |
| 3,988,612 | 10/1976 | Palmer | 338/15 X |
| 4,025,793 | 5/1977 | Shaw et al. | 250/211 R |
| 4,307,372 | 12/1981 | Matsui et al. | 338/15 |

OTHER PUBLICATIONS

Kinch et al., "Geometrical Enhancement of HgCdTe Photoconductive Detectors", Infrared Physics, 1977, vol. 17, pp. 137-145.

Primary Examiner—Roy N. Envall, Jr.
Assistant Examiner—C. N. Sears
Attorney, Agent, or Firm—Ronald L. Taylor

[57] ABSTRACT

A semiconductor photoconductor having low impedance nonmetallic contacts is disclosed which has increased detectivity over prior art photoconductor structures. The improved photoconductor has metallic contacts that are separated by a contact length that is greater than the optical length of the detector. The contact regions of the semiconductor adjacent the detector region are thicker than the detector region. The process for fabricating the photoconductor includes thinning the detector region to an appropriate thickness while preserving the greater thickness of the contact regions.

5 Claims, 4 Drawing Figures

THICK EXTENDED CONTACT PHOTOCONDUCTOR

BACKGROUND OF THE INVENTION

1. Field of the Invention

The disclosed invention relates generally to photoconductors. Particularly, the invention is directed to a photoconductor detector that is suitable for use in sensor systems that require large numbers of very small detectors for high resolution.

In a sufficiently small photoconductor detector, where the length between metallic contacts is less than the minority carrier diffusion length, the detectivity of the detector decreases with the length between metallic contacts.

2. Description of the Prior Art

The prior art includes detectors wherein the metallic contacts are deposited on the semiconductor material at the boundary of the detector region. Thus, the length between metallic contacts is the length of the detector region.

An improvement of the foregoing structure utilized extended contacts wherein the length between metallic contacts (as measured where the contacts are deposited on the semiconductor material) is increased by extending the contacts away from the detector region. In the extended region the contacts are insulated from the semiconductor material. Thus, the metal mask extends to the boundary of the detector region and the optical length of the detector region is preserved. The extended contact geometric, is disclosed in Kinch et al., *Geometrical Enhancement of HgCdTe Photoconductive Detectors*, Infrared Physics, 1977, Vol. 17, pp. 137-145.

Although the extended contact photoconductor provided increased detectivity, it was limited. Moreover, the prior art photoconductors did not have sufficient injection efficiency when used with current mode preamplifiers because of high contact impedance.

SUMMARY OF THE INVENTION

It is therefore an object of the invention to provide a photoconductor with increased detectivity.

Another object of the invention is to provide a photoconductor having more efficient injection efficiency.

Still another object of the invention is to provide an improved photoconductor having low contact impedance.

Yet another object of the invention is to provide a method of fabrication for producing an improved photoconductor.

The foregoing and other objects are achieved by a photoconductor having extended contacts over semiconductor regions that are thicker than the detector region thereby achieving low impedance nonmetallic contacts.

The improved process for fabricating a photoconductor includes selectively etching the semiconductor material to form a detector region that is thinner than the contact regions.

BRIEF DESCRIPTION OF THE DRAWINGS

The various advantages and features of the disclosed invention will be readily apparent to persons skilled in the art from the following detailed description of the invention when read in conjunction with the drawings wherein.

DETAILED DESCRIPTION

Figure 1:
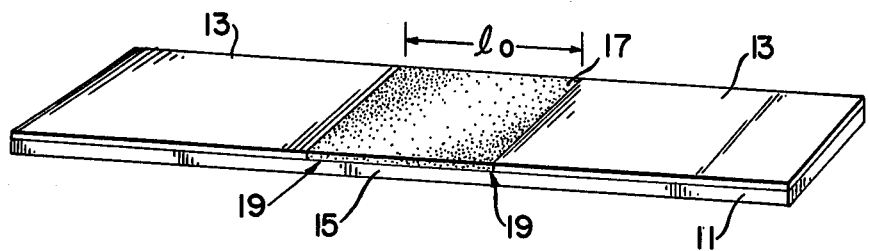
FIG. 1 shows a prior art conventional photoconductor.

The prior art structures of FIGS. 1 and 2 will first be discussed. Specifically, the structure of FIG. 1 includes a semiconductor slice 11 on which metallic contacts 13 are deposited. The semiconductor slice 11 has a detector region 15 which is covered by an appropriate transparent insulator 17. Metallic contacts are formed at locations 19 which are separated by the optical length $l_o$.

Figure 2:
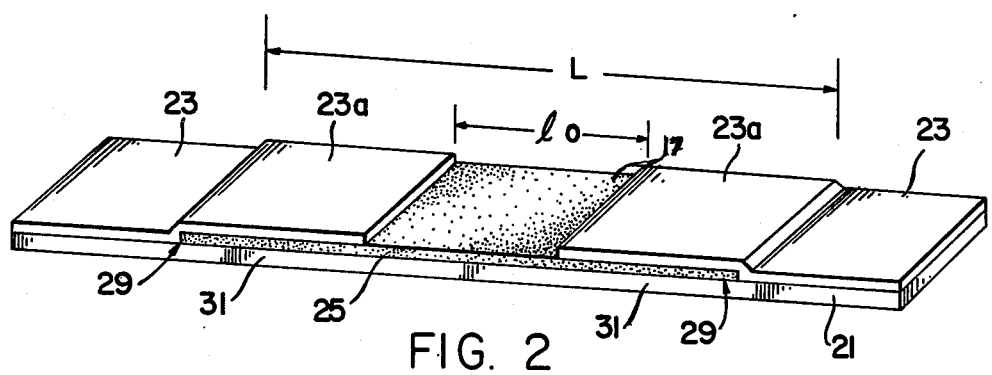
FIG. 2 shows a prior art extended contact photoconductor.

FIG. 2 shows the geometry of the prior art extended contact photoconductor that includes a semiconductor slice 21 on which metallic contacts 23 are deposited. The metallic contacts 23 include extended regions 23a that extend to a detector region 25 of the semiconductor slice 21. A transparent insulator 17 covers the detector region 25 and extends beneath the extended contacts 23a to separate the extended contacts from the semiconductor extended contact region 31. Thus, the length between the metallic contacts formed at locations 29 is greater than the optical length $l_o$.

In the prior art structures of FIGS. 1 and 2 the thickness of the semiconductors slices 11 and 21 is uniform (d) and appropriately limited to the penetration depth of the optical wave length of interest. In the prior structure of FIG. 1, the proximity of the metallic contacts at location 19 to the detector region 15 greatly increases the recombination rate in the detector region 15 and therefore reduces the density of photo-generated excess carriers, as described in the Kinch et al. reference identified previously.

In the prior art extended contact structure of FIG. 2, the metallic contacts at location 29 are away from the detector region 25, effectively creating nonmetallic contacts in the extended contact region 31 of the semiconductor slice 21. While reducing the "sweepout" effect of the conventional photoconductor of FIG. 1, the extended contact regions 31 provide a high contact impedance, thereby limiting injection efficiency, thereby limiting detectivity.

Figure 3:
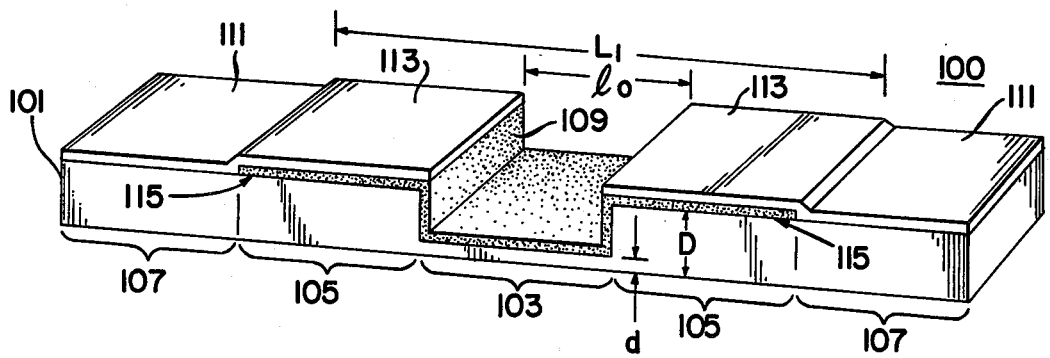
FIG. 3 shows the thick extended contact photoconductor of the invention wherein the semiconductor regions beneath the extended contacts are thicker than the detector region.

FIG. 3 shows the thick extended contact photoconductor 100 of the present invention. It includes an appropriately formed intrinsic semiconductor slice 101 which has a detector region 103, extended contact regions 105, and contact regions 107. The intrinsic semiconductor is preferably n-type mercury cadmium telluride $(Hg_{1-x}Cd_x)Te$, referred to herein as (HgCd)Te. Other intrinsic semiconductors that can be used include Indium Antimonide (InSb), lead sulfide (PbS) and lead telluride (PbTe). A transparent insulator 109 is deposited over the detector region 103 and the extended regions 105.

A metallic contact 111 is deposited on the semiconductor slice beyond the extended contact semiconductor regions 105. Extended metallic contacts 113 are deposited on the insulator 109 above the extended contact semiconductor region 105. The extended contacts 113, which are extended portions of the metallic contacts 111, extend horizontally to the boundaries of the detector region 103.

Metallic contacts are formed at the locations 115 at the boundaries of the extended contact semiconductor regions 105. Accordingly, the length L between the metallic contacts is greater than the optical length $l_o$ of the detector region 103. Further, the depth d of the detector region is smaller than the depth D of the extended contact semiconductor regions 105.

By way of example, a thick extended contact photoconductor 100 using (HgCd)Te has been fabricated wherein the optical length $l_o$ is about 33 microns. The length L between contacts is about 100 microns or approximately three times the optical length $l_o$. The depth d of the detector region 103 is about 7 microns and the depth D of the extended contact semiconductor regions 105 is about 25 microns or approximately 3.5 times the depth of the detector region.

The thick extended contact photoconductor 100 of FIG. 3 results in increased detectivity due, at least, in part, to increased injection efficiency. Specifically, the greater depth D of the extended contact semiconductor regions 105 results in considerably lower contact impedance. Thus, the greater depth of the extended contact regions effectively forms nonmetallic contacts of low impedance which conduct photogenerated excess carriers and reduce recombination. The photoconductor detector 100 provides considerably greater detectivity (and therefore sensitivity) than either the prior structures shown in FIGS. 1 and 2.

Figure 4:
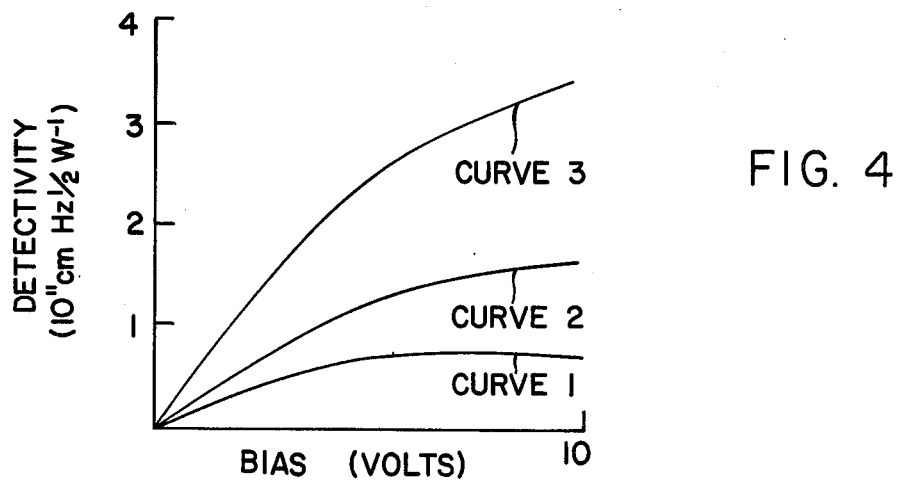
FIG. 4 shows the comparative performances of the photoconductor of the invention relative to the prior art structures.

The comparative of performance of all these structures is set forth in FIG. 4. Specifically, FIG. 4 is a graph illustrating the respective detectivities of the structures of FIGS. 1, 2, and 3 as a function of bias voltage applied to the metallic contacts of these structures. Detectivity is generally recognized as the signal to noise ratio multiplied by the square root of the product formed by multiplying the detector area by the noise bandwidth. Accordingly, for a given noise bandwidth and the same detector area, the graph of FIG. 4 demonstrates the advantages of the thick extended contact photoconductor 100 (FIG. 3) of the present invention.

Curve 1 of FIG. 4 represents the detectivity of the prior art photoconductor 10 shown in FIG. 1. Curve 2 of FIG. 4 represents the detectivity of the prior art extended contact photoconductor 20 shown in FIG. 2. Curve 3 of FIG. 4 represents the increased detectivity achieved by the thick extended contact photoconductor 100 of the present invention shown in FIG. 3.

The process for fabricating the thick extended contact photoconductor is as follows. A 500-micron thick slice of (HgCd)Te is anodized in a solution of 0.1 molar potassium hydroxide (KOH) in 90% ethylene glycol and 10% water. Anodizing makes the surface of the semiconductor inert to prevent deterioration. The semiconductor slice is then epoxied to a sapphire substrate.

The semiconductor is then mechanically lapped to a thickness of approximately 60 microns by first using an abrasive of 20-65 micron alumina powder and following that with one micron alumina powder. The HgCdTe is further thinned to the contact and extended contact region depth of about 25-30 microns by dipping it in a solution of 5% bromine in methanol.

The thick contact and extended contact regions (corresponding to the regions 105 and 107 in FIG. 3) are coated with a negative photoresist such as Kodak brand thin film resist. The detector region is then thinned to the range of 5-7 microns by dipping the semiconductor in a 5% bromine/methanol solution. The negative photoresist is removed in a plasma etch chamber.

The detector region and the contact and extended contact regions are then coated with negative photoresist. The photoconductor device (corresponding to the semiconductor slice 101 of FIG. 3) is etched out by dipping the semiconductor in a 5% bromine/methanol solution. The remaining semiconductor structure forms the detector region, contact regions, and extended contact regions which comprise the detector array. The negative photoresist is removed in a plasma etch chamber.

Oxide is removed from the exposed semiconductor surface by dipping the device in 0.128 molar hydrochloric acid (H Cl). The exposed surface is then cleaned by dipping the device in a 5% bromine/methanol solution. The detector array is then anodized in a solution of 0.1 molar potassium hydroxide in 90% ethylene glycol and 10% water.

A layer of zinc sulfide (ZnS) having a thickness of about 4,000 angstroms is deposited on the detector and contact regions. The zinc sulfide will form the insulator over the detector and extended contact regions. It should also be noted that the zinc sulfide serves as an antireflection coating for the detector region. The portions of the zinc sulfide insulator above the detector and extended contact regions are coated with a positive photoresist. The zinc sulfide and oxide from the contact regions are removed by dipping the photoconductor in aqua regia. The positive photoresist is removed by acetone and the zinc sulfide remains only over the detector region and the extended contact regions.

The detector region is then coated with positive photoresist and a layer of tin (Sn) having a thickness of about 2,000 angstroms is deposited on the device. The device is placed in acetone and rinsed to remove the excess tin and the photoresist from the detector region.

At this point, the structure shown in FIG. 3 has been completed. The device is then annealed at 78° C. for 15 minutes.

Although the foregoing has been a description of the preferred embodiments of the invention, changes and modifications can be made thereto by persons skilled in the art without departing from the spirit and scope of the invention defined by the following claims.

What is claimed is:

1. A photoconductor array comprising:
   semiconductor material having a detector region with an associated optical length and low impedance nonmetallic contact regions, said contact regions being thicker than said detector regions, and
   metallic contacts with said nonmetallic contact regions so that the length between metallic contacts is greater than the optical length of said detector region.

2. The photoconductor array of claim 1 wherein said metallic contacts extend over said low impedance nonmetallic contact regions to said detector region.

3. The photoconductor array of claim 1 wherein said semiconductor material is an intrinsic n-type semiconductor.

4. A photoconductor device comprising:
   a semiconductor photodetector region;

nonmetallic contact means coupled to said detector region for providing a low impedance and for conducting photo-generated excess carriers and to reduce recombination, said nonmetallic contact means including semiconductor material that is thicker than said semiconductor photodetector region; and metallic contacts coupled to said nonmetallic contact means.

5. A photoconductor device comprising:

a semiconductor photodetector region;

nonmetallic contact means coupled to said detector region for providing a low impedance and for conducting photo-generated excess carriers and to reduce recombination, said nonmetallic contact means comprising a single piece of semiconductor material having a detector region and low impedance nonmetallic contact regions which are thicker than said photodetector region;

and metallic contacts coupled to said nonmetallic contact means.

* * * * *